(12) United States Patent
Wickeraad et al.

(10) Patent No.: US 7,757,152 B2
(45) Date of Patent: Jul. 13, 2010

(54) DATA CORRUPTION SCRUBBING FOR CONTENT ADDRESSABLE MEMORY AND TERNARY CONTENT ADDRESSABLE MEMORY

(75) Inventors: John Wickeraad, Granite Bay, CA (US); Mark Gooch, Roseville, CA (US); Alan Albrecht, Granite Bay, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 1301 days.

(21) Appl. No.: 11/207,357

(22) Filed: Aug. 18, 2005

(65) Prior Publication Data

US 2007/0061668 A1 Mar. 15, 2007

(51) Int. Cl.
 *G11C 29/00* (2006.01)
(52) U.S. Cl. .................. 714/763; 714/766
(58) Field of Classification Search .......... 714/763, 714/766
 See application file for complete search history.

(56) References Cited

U.S. PATENT DOCUMENTS

| | | | | |
|---|---|---|---|---|
| 4,058,851 A * | 11/1977 | Scheuneman | ............... | 714/6 |
| 5,053,991 A * | 10/1991 | Burrows | ............... | 365/49.17 |
| 5,111,427 A * | 5/1992 | Kobayashi et al. | ..... | 365/185.07 |
| 5,130,945 A * | 7/1992 | Hamamoto et al. | ...... | 365/49.17 |
| 5,233,610 A * | 8/1993 | Nakayama et al. | .......... | 714/704 |
| 5,245,617 A * | 9/1993 | DeSouza et al. | ............. | 714/766 |
| 5,258,946 A * | 11/1993 | Graf | ........................ | 365/49.17 |
| 5,311,462 A * | 5/1994 | Wells | ........................ | 365/49.1 |
| 5,491,703 A * | 2/1996 | Barnaby et al. | ............. | 714/766 |
| 5,699,346 A * | 12/1997 | VanDervort | ................. | 370/233 |
| 5,796,758 A * | 8/1998 | Levitan | ..................... | 714/800 |
| 6,690,595 B1 * | 2/2004 | Srinivasan et al. | ....... | 365/49.17 |
| 6,700,827 B2 * | 3/2004 | Lien et al. | ................... | 365/222 |
| 6,760,881 B2 * | 7/2004 | Batson et al. | ............... | 714/773 |
| 6,987,684 B1 * | 1/2006 | Branth et al. | ............. | 365/49.17 |
| 7,100,097 B2 * | 8/2006 | Patella et al. | ................. | 714/718 |
| 7,237,172 B2 * | 6/2007 | Regev et al. | ................. | 714/754 |
| 7,254,748 B1 * | 8/2007 | Wright et al. | ................. | 714/43 |
| 7,277,306 B2 * | 10/2007 | Noda et al. | ................. | 365/49.1 |
| 7,304,873 B1 * | 12/2007 | Gupta | ........................ | 365/49.1 |
| 2004/0083421 A1 * | 4/2004 | Foss et al. | ................... | 714/805 |
| 2004/0120173 A1 * | 6/2004 | Regev et al. | ................. | 365/49 |

* cited by examiner

*Primary Examiner*—M. Mujtaba K Chaudry

(57) ABSTRACT

A method for remedying data corruption in a first circuit, which may be a CAM or a TCAM. The method includes providing a RAM circuit external to the first circuit, the RAM circuit being configured for storing error detection information for data stored in the first circuit. The method also includes scrubbing the data stored in the first circuit during scrubbing cycles of the first circuit. The scrubbing corrects stored bit patterns read from the first circuit that fail an error detection test using error detection information corresponding to individual ones of the stored bit patterns. In an embodiment, ECC may be employed for the error detection test and also to correct any single bit error found.

30 Claims, 6 Drawing Sheets

DATA CORRUPTION SCRUBBING FOR CONTENT ADDRESSABLE MEMORY AND TERNARY CONTENT ADDRESSABLE MEMORY

BACKGROUND OF THE INVENTION

Content-Addressable Memories (CAMs) and Ternary Content-Addressable Memories (TCAMs) have been in use for some time. CAMs and TCAMs are routinely employed in various applications including, for example, lookup tables for IP (Internet Protocol) routers.

To facilitate discussion of CAMs and TCAMs, FIG. 1 shows a portion of an example prior art CAM 100 that is configured to decode an input pattern of 3 bits to a single match result. In a typical real world application, however, the number of bits may vary. Furthermore, CAMs may be implemented using different technologies although the basic functions described below are essentially the same for all CAMs.

In FIG. 1, there are shown three input lines B1, B2, and B3, representing the input lines for the input bits. The bit lines are intersected by a plurality of word compare circuits W1, W2, W3, etc. . . . Since the example of FIG. 1 involves 3 input bits, there may be $2^3$ or 8 possible word combinations and hence 8 possible word compare circuits W1-W8. In other implementations, there may be a greater or fewer number of word compare circuits than $2^n$ (where n=number of input bits).

Each word compare circuit includes a plurality of bit compare circuits, with each bit compare circuit being associated with one of input bit lines B1-B3. Thus, in word compare circuit W1, there are three bit compare circuits 110, 112, and 114 corresponding to respective input bits B1, B2, and B3. Each of bit compare circuits 110, 112, and 114 includes a compare value storage cell and cell compare circuitry. For example, bit compare circuit 110 includes a compare value storage cell D1 and cell compare circuitry 122.

A compare value storage cell, such as compare value storage cell D1, is used to store one bit of data against which the corresponding input bit is compared. The comparison is performed by the associated cell comparison circuitry (so that cell comparison circuitry 122 would be employed to compare input bit B1 against the data value stored in compare value storage cell D1, for example).

In a typical implementation, the compare value storage cells of CAMs (such as compare value storage cell D1) is implemented using SRAM (Static Random Access Memory) technology. SRAM technology is typically employed due to the high density offered. Generally speaking, TCAMs also employ SRAM technology for their compare value storage cells and mask value storage cells for the same reason. The bit compare circuit may be implemented using a combination of an XNOR gate and an AND gate connected as shown in cell compare circuitry 122. The inputs for each AND gate (such as AND gate 130 of cell compare circuit 112) are taken from the output of the associated XNOR gate (such as XNOR gate 132) and the output of the previous bit compare circuit (such as bit compare circuit 110). If there is no output from the previous bit compare circuit, a value "1" is used (as can be seen with AND gate 140).

Suppose that the three compare value storage cells associated with word compare circuit W1 store the bit pattern "101". This bit pattern "101" is compared against the bit pattern inputted into bit lines B1-B3. If the input bit pattern presented on bit lines B1-B3 is also "101", the comparison result against the data values stored in word compare circuit W1 would be a match, and the output 160 of word compare circuit W1 would be active. Any word compare circuit whose stored bit pattern is different from "101" would have an inactive output. On the other hand, if the input bit pattern presented on bit lines B1-B3 is "111", the comparison result against the data values stored in word compare circuit W1 would not be a match, and the output 160 of word compare circuit W1 would be inactive. The word compare circuit whose stored bit pattern is "111" would have an active output.

As can be seen, CAM 100 returns at most a single match ($W_1 \ldots W_N$) for a given input bit pattern (assuming that a unique input bit pattern is loaded or stored in each word compare circuit). The match ($W1 \ldots W_N$) may then be encoded to an address of the matched word.

TCAMs are similarly constructed as seen in FIG. 2. A TCAM offers the ability to mask certain input bits per entry, turning these input bits into "don't care" bits. For example, whereas the input bit pattern "011" would yield a single match using a CAM, it is possible to specify that the first bit "0" is a "don't care" for a specific entry. In this case, the first bit is said to be "masked" during the comparison process, and the result matches against either stored bit pattern "111" or "011". For TCAMs, it is common for multiple entries to match, and the first match is typically selected and the address of the first match encoded.

The difference between FIG. 2 (TCAM) and FIG. 1 (CAM) is the presence of the mask bit storage cells M1, M2, and M3, and the extra OR gates 202, 204, and 206. Each OR gate is inserted between the output of the XNOR gate and the input of the AND gate in each bit compare circuit. For example, OR gate 204 has two inputs: the output of XNOR gate 132 and the value of the mask bit in mask bit storage cell M1. It should be apparent to one skilled in the art that when the mask bit is "0", the associated TCAM bit storage circuit functions in the same manner as the CAM bit storage circuit of FIG. 1. When the mask bit is "1", the associated TCAM bit storage circuit implements the "don't care" function.

As mentioned, both CAMs and TCAMs are implemented using SRAM technology. SRAM technology, as is known, suffers from soft errors, which is attributed to the presence of naturally occurring alpha particles. SRAM memory chips, which are employed to store data for use by computer applications and/or the operating system, may employ error correcting code (ECC) or parity bits for the stored words. For example, a parity bit may be stored for each data word written into the SRAM memory chip. Parity checking may be performed after reading the stored data word from the SRAM memory to ensure data integrity. By checking for parity, a soft error on one of the stored bits can be detected before a stored data word is utilized.

With CAMs and TCAMs, error detection is more difficult since the corruption of one or more bits may still yield a match output, albeit the wrong match output. For example, if a stored bit pattern "101" is corrupted and becomes "001" due to a soft error on the most significant bit, inputting a bit pattern of "001" may yield a match output, albeit a match output that is due to soft error. The input bit pattern "101" may yield a "no match" result, which is also a legitimate output for CAMs and TCAMs. Thus, unlike SRAM memory chips, the outputs of CAMs and TCAMs (which reflect a match or no match) do not lend themselves to parity checking easily. This is because the output of a CAM/TCAM is either a no-match or a match (which is then decoded into an output address) instead of the stored bits themselves (as in the case with SRAMs). Accordingly, performing parity/ECC on the CAM/TCAM output would not reveal the data corruption that occurs to the stored bit pattern inside the CAM/TCAM. This is in contrast to the case with SRAM, whereby the output is the read stored bit pattern itself and parity/ECC can be applied to the stored bit pattern read from memory prior to use.

Data corruption is also exacerbated as the device geometries shrink. As devices become smaller, the compare value storage cells and/or the mask bit storage cells become more susceptible to data corruption. Additionally, as CAMs and TCAMs become denser and include a larger number of storage cells, the probability of corruption to one of the stored compare value bits or stored mask bits increases. Furthermore, as manufacturers pack more devices into smaller form factors, devices are being placed near and/or under area bumps (i.e., the connection points to connect the chip to the outside world). It has been found that storage cells near and/or under the area bumps tend to suffer a higher rate of soft errors.

Because of the increased likelihood of soft errors, manufacturers have become concerned over CAM and TCAM reliability. To the inventor's knowledge, the solution thus far has been to periodically reload the CAMs and TCAMs with fresh compare values and/or fresh mask bit values. However, this approach is inefficient since the CAMs/TCAMs are essentially unusable during the loading process. Furthermore, from the time the soft error occurred until the CAM/TCAM is reloaded, incorrect results may occur.

In view of the foregoing, improved solutions for managing soft errors in CAMs/TCAMs are needed.

SUMMARY OF THE INVENTION

The invention relates, in an embodiment, to a method for remedying data corruption in a first circuit, the first circuit representing one of a content addressable memory (CAM) and a ternary content addressable memory (TCAM). The method includes providing a random access memory (RAM) circuit, the RAM circuit being external to the first circuit, the RAM circuit being configured for storing error detection information for data stored in the first circuit. The method also includes scrubbing the data stored in the first circuit during scrubbing cycles of the first circuit. If a stored bit pattern fails an error detection test, the error is remedied by scrubbing.

In another embodiment, the invention relates to a method for remedying data corruption in a first circuit. The first circuit represents one of a content addressable memory (CAM) and a ternary content addressable memory (TCAM). The method includes providing a random access memory (RAM) circuit, the RAM circuit being external to the first circuit, the RAM circuit storing a plurality of error detection information items for a plurality of respective data words stored in the first circuit. The method also includes reading a first data word from the first circuit and a corresponding first error detection information item from the RAM circuit during a first idle cycle of the first circuit. The method also includes performing error checking on the first data word using the corresponding first error detection information item. If the error checking reveals an error, the method includes performing error correction to obtain an error-free version of the first data word and loading the error-free version of the first data word back into the first circuit, thereby replacing the first data word with the error-free version of the first data word in the first circuit.

In yet another embodiment, the invention relates to an arrangement for remedying data corruption in a first circuit, the first circuit representing one of a content addressable memory (CAM) and a ternary content addressable memory (TCAM). The arrangement includes a random access memory (RAM) circuit, the RAM circuit being external to the first circuit, the RAM circuit being configured for storing error detection information for data stored in the first circuit. The arrangement also includes an error detection information generator coupled to the RAM circuit, the error detection information generator being configured to receive data destined to be stored in the first circuit and computing at least a portion of the error detection information from the data destined to be stored in the first circuit. The arrangement additionally includes a second circuit implementing a state machine for scrubbing the data stored in the first circuit, the scrubbing being configured to correct stored bit patterns that fail an error detection test using error detection information corresponding to the stored bit patterns, the stored bit patterns being read from the first circuit during scrubbing cycles of the first circuit.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. The features and advantages of the present invention may be better understood with reference to the drawings and discussions that follow.

Figure 1:
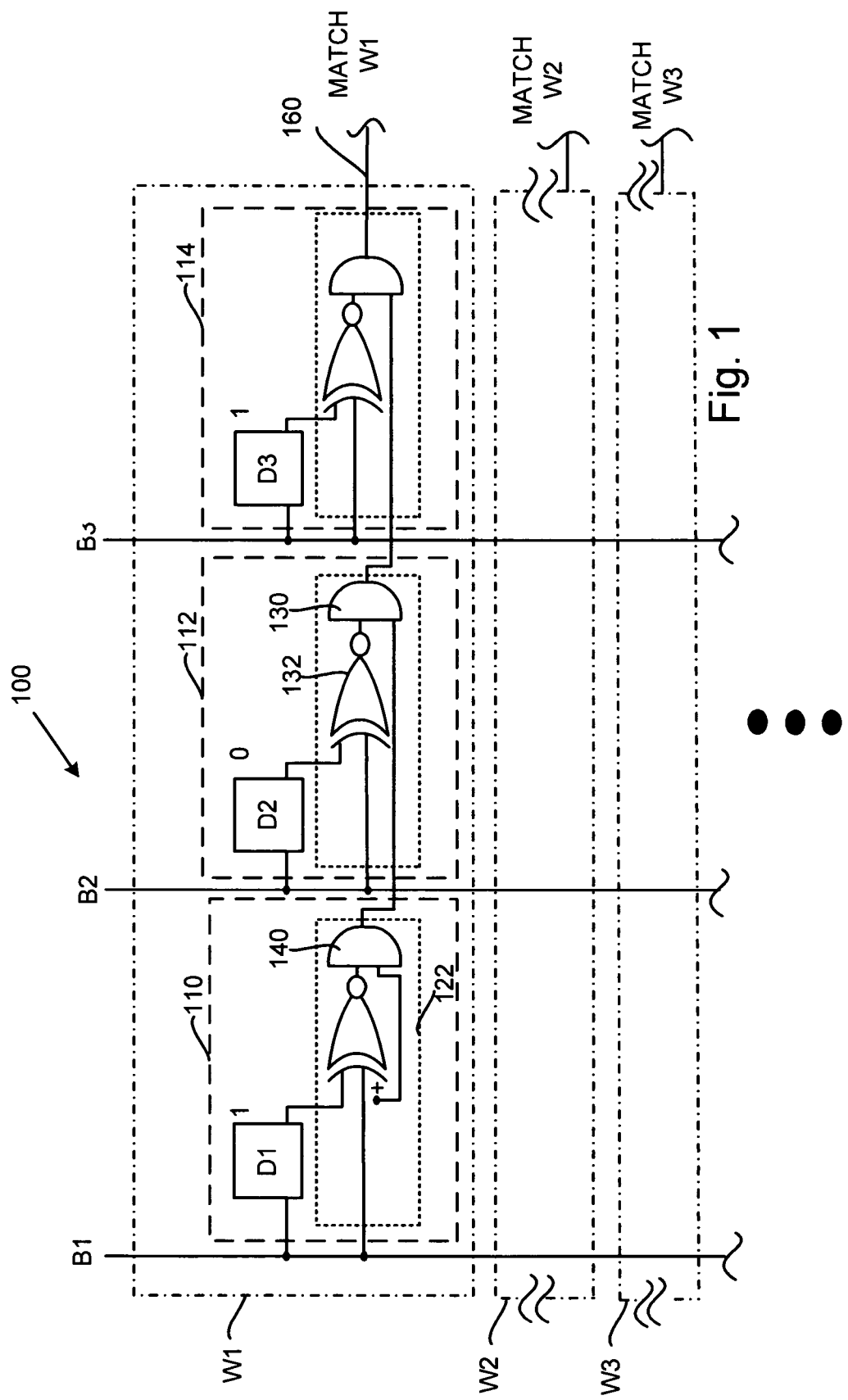
FIG. 1 shows a portion of an example prior art CAM.
Figure 2:
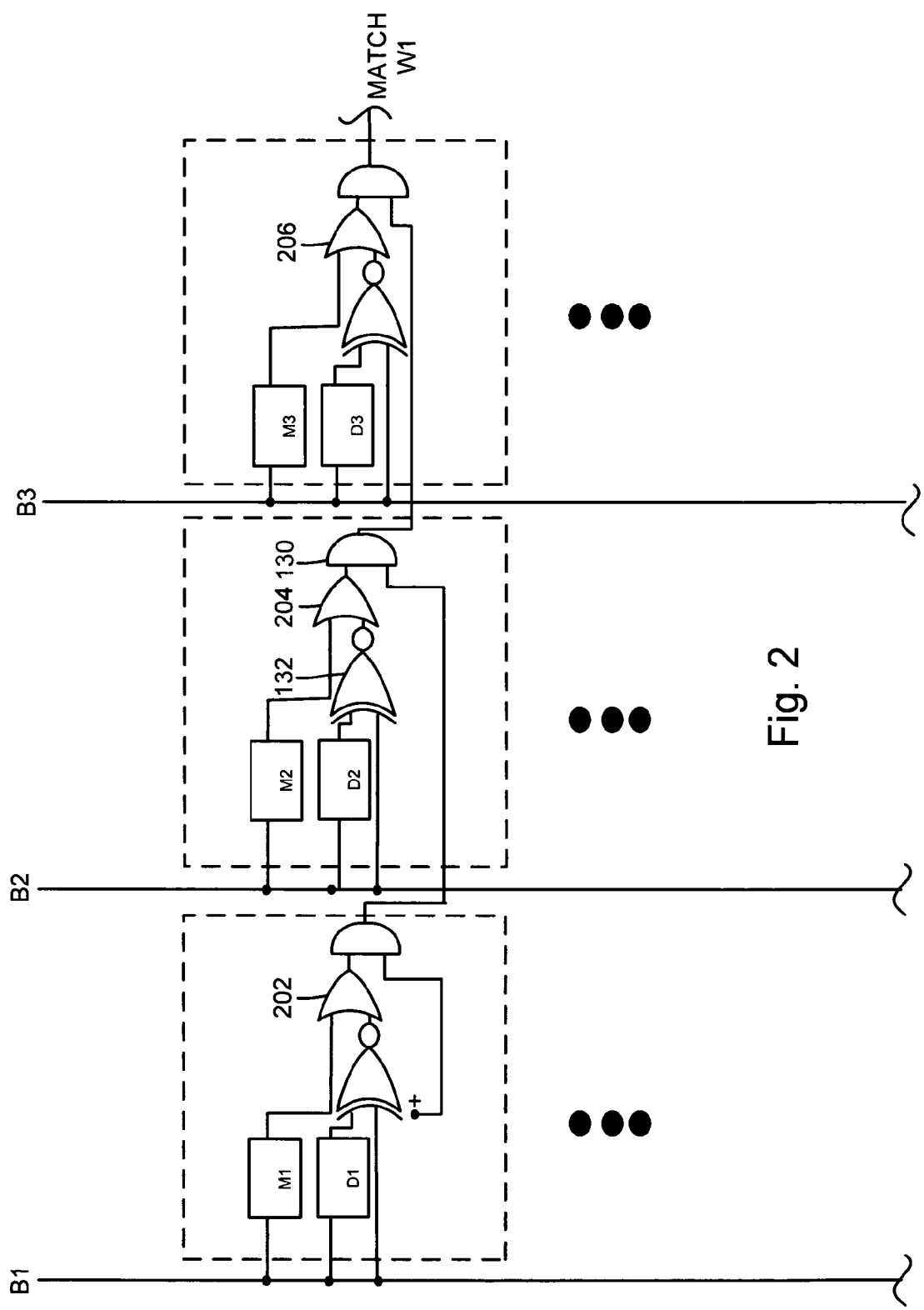
FIG. 2 shows a portion of an example prior art TCAM.
Figure 3:
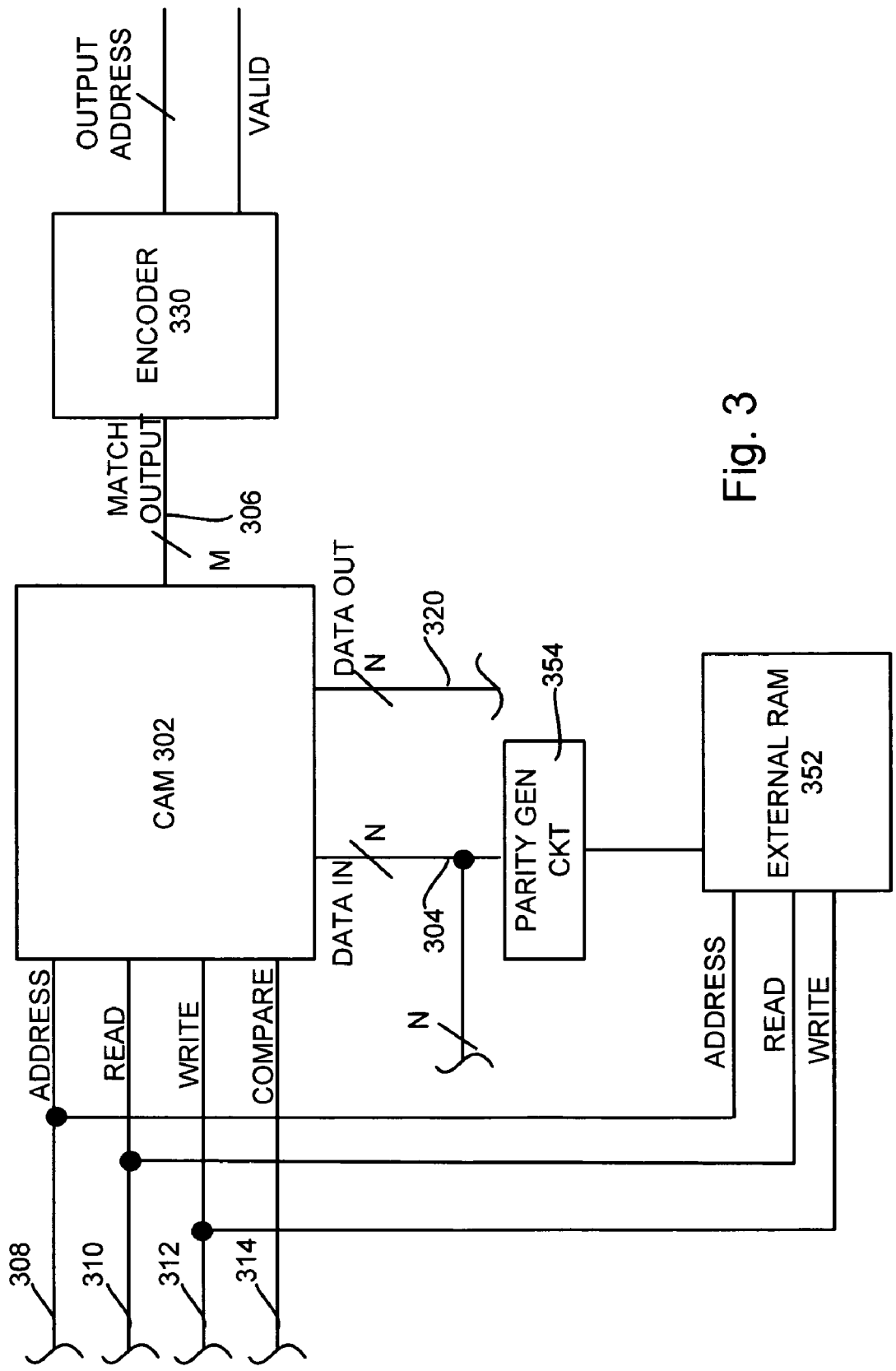
FIG. 3 shows, in accordance with an embodiment of the present invention, a parity-checking CAM arrangement for remedying storage bit corruption.

FIG. 3 shows, in accordance with an embodiment of the present invention, a parity-checking CAM arrangement for remedying storage bit corruption. For easy understanding, the examples herein focus primarily on CAMs. It should be understood, however, that embodiments of the invention also apply to TCAMs. Some details pertaining to TCAM adaptation will be discussed. However, it is assumed that one skilled in the art can apply conventional knowledge to adapt the discussion to TCAMs if certain details are not explicitly mentioned.

Referring back to FIG. 3, there is shown a CAM block 302, representing the circuitry that implements the above-discussed CAM function. CAM block 302 is typically a circuit provided by a CAM manufacturer who specializes in manufacturing CAMs. CAM block 302 includes a data bus 304 having N bits, and a set of CAM outputs 306 comprising M outputs. In many cases, CAM block 302 represents circuitry that cannot be easily modified and thus error detection/correction is implemented using a circuit that is external to the circuit that implements CAM block 302.

There is also an address bus 308 having an adequate number of bits to cover all the M word compare circuits within CAM block 302. In the case of CAM, for example, if there are 8 word compare circuits, the address bus may contain 3 bits (since 2^3 covers all 8 word compare circuits). If FIG. 3 reflects a TCAM instead, address bus 308 may include an extra address bit to specify whether the data being accessed (for reading or writing) pertains to the compare values or the mask bits. Alternatively, the TCAM may employ a separate signal to specify whether the data being accessed (for reading or writing) pertains to the compare values or the mask bits.

Read signal 310 represents the signal employed to read a bit pattern from a particular address specified by address bus 308, which bit pattern may represent either the stored compare values or the stored mask bits (for TCAMs) as specified. The read bit pattern are output on an output data bus 320.

Write signal 312 represents the signal employed to write a bit pattern presented on input data bus 304 to a particular address specified by address bus 308. The bit pattern written may represent either the stored compare values or the stored mask bits as specified. Similarly, compare signal 314 represents the signal employed to compare a bit pattern presented on input data bus 304 against the stored bit patterns within the CAM. For a TCAM the stored mask data is used during the compare operation to select what bits to compare for that entry.

Output bus 306 is encoded into an address and a valid signal by encoder 330. The address is then utilized by other circuitry in order to, for example, route IP packets. The valid signal indicates that there is a valid match. If no valid signal is asserted, no match is found for the input bit pattern. For TCAMs, encoder 330 additionally includes circuitry to select the first match from the (possible) plurality of matches (which are the result of don't care bits).

Since CAM block 302 is typically provided by a CAM manufacturer, it is often not possible to modify the circuitry within CAM block 302 to implement parity checking and/or ECC if such capability is not provided. In accordance with an embodiment of the present invention, an external RAM may be employed to provide the parity and/or ECC function for the data stored in CAM block 302.

For example, an external RAM 352 is coupled to a parity generator circuit 354, which generates a parity value from the data present at input data bus 304. Each time a pattern is written into CAM block 302, a computed parity value is written into external RAM 352 at the address specified by address bus 308. Thus each stored bit pattern in CAM 302 has a corresponding parity value in external RAM 352.

In the case of a CAM having M word compare circuits, the depth of external RAM 352 is M (i.e., there are M parity bits stored in external RAM 352). In the case of a TCAM having M word compare circuits, the depth of external RAM 352 is M*2 since there are M parity bits for the stored compare values and M parity bits for the stored mask values. In the case of a TCAM having M word compare circuits and N bits per word, if ECC is implemented (single bit detection, double bit correction), log 2(N) bits are provided in external RAM 352 per CAM word.

It has been noted by the inventor herein that a typical CAM/TCAM may be idle for some percentage of time. In other words, there are periods of time during operation when no reading, writing, or comparing activities involving the CAM/TCAM occurs. The inventor herein realizes that if this time can be employed to scrub the content of the CAM/TCAM to detect and/or correct the data corruption, the reliability of the CAM/TCAM may be vastly improved with minimal or no time overhead to the overall system performance. However, it should be understood that if data protection is a high priority, scrubbing may also be performed during a non-idle cycle, i.e., a cycle specifically allocated for the scrubbing even though the CAM/TCAM may not have any idle cycle to spare.

Figure 4A:
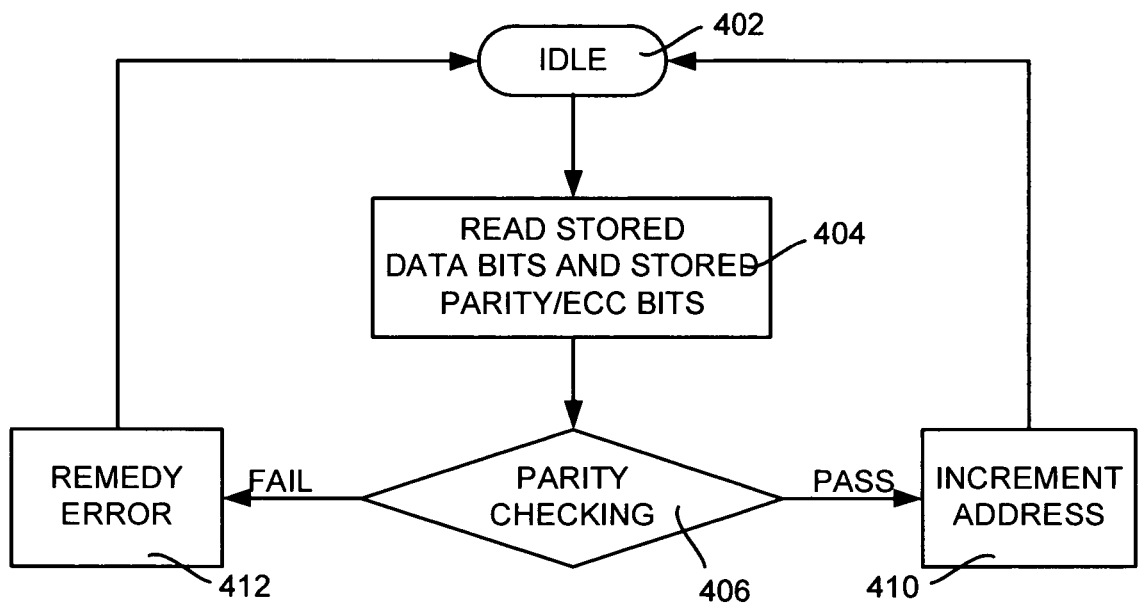
FIG. 4A shows, in accordance with an embodiment of the present invention, a flowchart for implementing scrubbing on the CAM to detect and/or correct the corruption of the stored bit pattern using parity.

FIG. 4A shows, in accordance with an embodiment of the present invention, a flowchart for implementing scrubbing on the CAM to detect and/or correct the corruption of the stored bit pattern using parity. Generally speaking, an arbiter is employed to monitor for inactivity on the CAM. For example, the arbiter circuit may monitor the read, write, and compare signals for inactivity. If no reading/writing/comparing occurs, the CAM is deemed idle or in an idle cycle (402) and scrubbing may commence.

As the term is employed herein, scrubbing refers to sequentially crawling (i.e., reading, checking and correcting if necessary) through the stored bit patterns during one or more cycles of the CAM. Although scrubbing may be performed to advantage during idle cycles, scrubbing may also be performed during non-idle cycles (i.e., during cycles allocated for the scrubbing activity although the CAM or TCAM may not have idle cycles to spare). The cycles during which scrubbing occurs are referred to herein as scrubbing cycles and may represent either idle cycles or non-idle cycles.

To implement scrubbing in the present example, the method sequentially "crawls" through the stored bit patterns stored in CAM 302 and performs parity checking (406) on each stored bit pattern read (404) from CAM 302. In parallel, the parity/ECC information is also read from external memory 352.

In step 406, the result of the parity checking on the stored bit pattern read is either pass or fail. If pass, the address is incremented (410) to allow the next bit pattern to be "scrubbed,", i.e., read from CAM 302 and checked. Note that the next stored bit pattern is not read until there is an idle cycle in the CAM or until scrubbing is deemed necessary (in which case, a non-idle cycle may be allocated for scrubbing). In some cases, a stored bit pattern may be read and checked, and the CAM may proceed with some read/write/compare activity with respect to the data stored in the CAM before the next stored bit pattern may be read and checked. If there is no read/write/compare activity with respect to the data stored in the CAM, stored bit patterns may be read and checked consecutively without interruption.

If fail, the error is remedied in step 412. The remedy may include, for example, interrupting the CPU and reloading the failed bit pattern from an external data store to CAM 302.

Figure 4B:
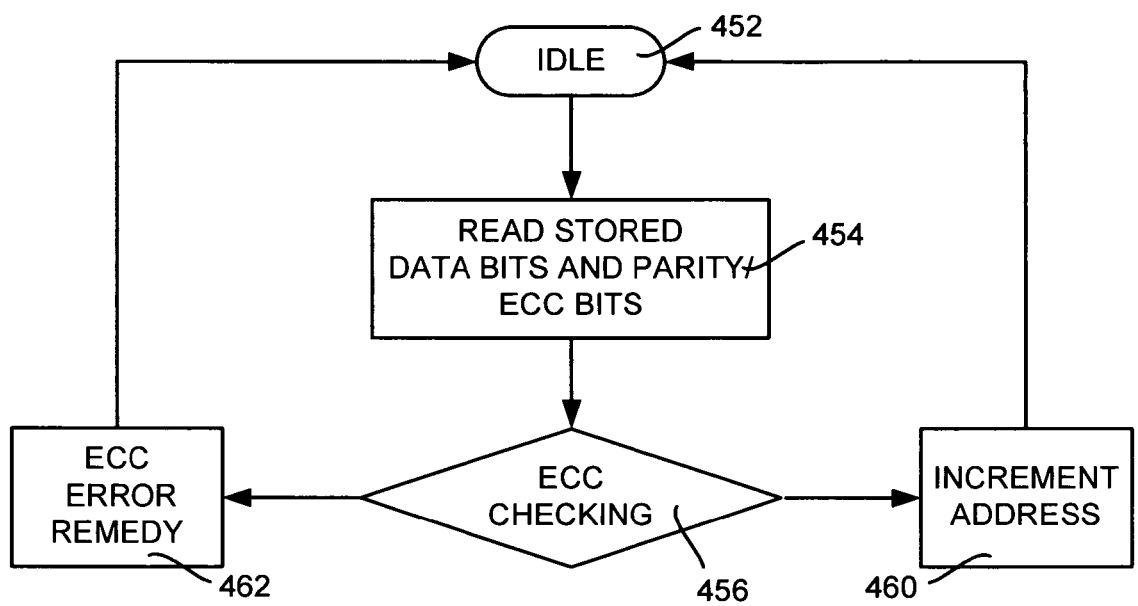
FIG. 4B shows, in accordance with an embodiment of the present invention, a flowchart for implementing scrubbing on the CAM to detect and/or correct the corruption of the stored bit pattern using ECC.

FIG. 4B shows, in accordance with an embodiment of the present invention, a flowchart for implementing scrubbing on the CAM to detect and/or correct the corruption of the stored bit pattern using ECC. Generally speaking, an arbiter is employed to monitor for inactivity on the CAM. For example, the arbiter circuit may monitor the read, write, and compare signals for inactivity. If no reading/writing/comparing occurs, the CAM is deemed idle (452) and scrubbing may commence. As mentioned, scrubbing may also employ a non-idle cycle if scrubbing is deemed a high enough priority activity to justify the use of a non-idle cycle. To implement scrubbing, the method "crawls" through the stored bit patterns stored in CAM 302 and performs checking (456) on each stored bit pattern read (454) from CAM 302.

In step 456, the result of the error checking is either pass or fail. If pass, the address is incremented (460) to allow the next bit pattern to be read from CAM 302 and checked. This step 460 is similar to step 410 in FIG. 4A. If fail, ECC is employed in step 462 to correct the error and to reload the corrected bit pattern to CAM 302 during the next idle cycle, for example. During EEC correction, an interlock mechanism may be employed, in an embodiment. to prevent the CPU from writing to the bit pattern being corrected.

With respect to FIGS. 4A and 4B, if a TCAM is involved instead of a CAM, the bit pattern read/checked/corrected may pertain to either the compare value stored bits or the mask value stored bits. Whether the compare value stored bits or the mask value stored bits are read/checked/corrected may depend on the address specified (if an extra address bit is employed to distinguish between stored compare values and stored mask values) or on the state of the extra signal employed to distinguish between stored compare values and stored mask values. In an embodiment, parity/ECC check may be performed on the combined compare value stored bits and the mask value stored bits. In this embodiment, both words may be read and a single parity/ECC check may be performed on both words.

Figure 5:
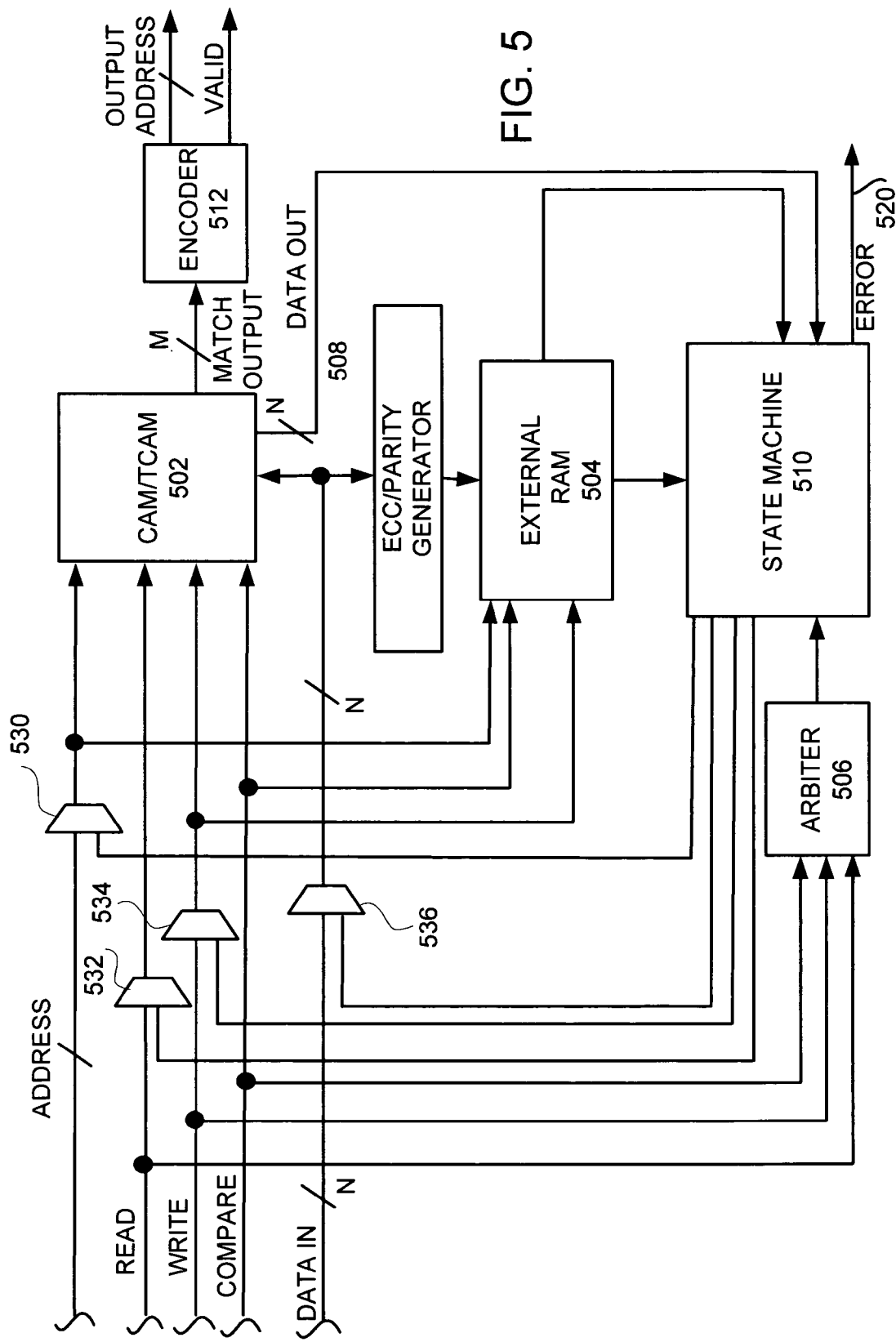
FIG. 5 shows, in accordance with an embodiment of the invention, a more complete example implementation of an arrangement for remedying data corruption in a CAM/TCAM.

FIG. 5 shows, in accordance with an embodiment of the invention, a more complete example implementation of an arrangement for remedying data corruption in CAM/TCAM 502, including the external RAM 504, and an arbiter circuit 506 which monitors for inactivity on the CAM/TCAM, and ECC/parity generator circuit 508. FIG. 5 also includes a state machine 510, representing a circuit that implements the method described in connection with FIG. 4A or FIG. 4B. There is also shown an encoder circuit 512, the function of which has been described earlier in connection with FIG. 3.

Generally speaking, state machine 510 is granted the lowest priority by arbiter 506 such that scrubbing occurs when there are no reading/writing/comparing activities on the CAM/TCAM 502. During scrubbing, state machine 510 crawls through the content of CAM/TCAM 502 to scrub errors. State machine 510 may sequentially read stored data patterns from CAM/TCAM 502 and corresponding parity/ECC information from external RAM 504 to generate an error signal 520 if an error is detected. Multiplexers 530 and 532 facilitate reading from the CAM/TCAM 502 and external RAM 504. Error signal 520 may be employed to initiate error remedy as discussed. If ECC correction is performed by state machine 510, for example, multiplexers 530, 534, and 536 facilitate writing the corrected bit pattern (and computed parity/ECC information) to CAM/TCAM 502 and external RAM 504 respectively. Multiplexer 536 may be employed during ECC and is controlled by state machine 510.

While this invention has been described in terms of several preferred embodiments, there are alterations, permutations, and equivalents which fall within the scope of this invention. It should also be noted that there are many alternative ways of implementing the apparatuses of the present invention. It is therefore intended that the following appended claims be interpreted as including all such alterations, permutations, and equivalents as fall within the true spirit and scope of the present invention.

The invention claimed is:

1. A method for remedying data corruption in a first circuit, said first circuit representing one of a content addressable memory (CAM) and a ternary content addressable memory (TCAM), comprising:
   providing a random access memory (RAM) circuit, said RAM circuit being external to said first circuit, said RAM circuit being configured for storing error detection information for data stored in said first circuit;
   providing an error detection information generator, said error detection information generator being configured to receive data destined to be stored in said first circuit, wherein the RAM circuit is configured for storing the received data as the error detection information; and
   scrubbing said data stored in said first circuit during scrubbing cycles of said first circuit, said scrubbing correcting stored bit patterns read from said first circuit that fail an error detection test using the error detection information stored in the RAM circuit corresponding to individual ones of said stored bit patterns, wherein said scrubbing includes sequentially reading and correcting said stored bit patterns in different idle cycles of said first circuit.

2. The method of claim 1 wherein said scrubbing reads two consecutive stored bit patterns in idle cycles that are uninterrupted by one of a read, write, and compare activity with respect to said data stored in said first circuit.

3. The arrangement of claim 1 wherein said scrubbing reads two consecutive stored bit patterns in idle cycles that are interrupted by one of a read, write, and compare activity with respect to said data stored in said first circuit.

4. The method of claim 1 wherein said error detection information represents parity information.

5. The method of claim 1 wherein said error detection information includes Error Correction Code (ECC).

6. The method of claim 1 wherein said first circuit is said CAM.

7. The method of claim 6 wherein said data stored in said first circuit represents compare value stored bits.

8. The method of claim 1 wherein said first circuit is said TCAM.

9. The method of claim 8 wherein said data stored in said first circuit represents mask value stored bits.

10. The method of claim 8 wherein said data stored in said first circuit represents compare value stored bits.

11. A method for remedying data corruption in a first circuit, said first circuit representing one of a content addressable memory (CAM) and a ternary content addressable memory (TCAM), comprising:
   providing a random access memory (RAM) circuit, said RAM circuit being external to said first circuit, said RAM circuit storing a plurality of error detection information items for a plurality of respective data words stored in said first circuit;
   reading a first data word from said first circuit and a corresponding first error detection information item from said RAM circuit during a first idle cycle of said first circuit;
   performing error checking on said first data word using said corresponding first error detection information item; and
   if said error checking reveals an error, performing error correction to obtain an error-free version of said first data word and loading said error-free version of said first data word back into said first circuit, thereby replacing said first data word with said error-free version of said first data word in said first circuit.

12. The method of claim 11 further comprising:
if said error checking reveals that said first data word is error-free, reading another data word from said first circuit and a corresponding second error detection information item from said RAM circuit to facilitate said performing error checking on said another data word in the next idle cycle of said first circuit.

13. The method of claim 11 wherein said error detection information represents parity information.

14. The method of claim 11 wherein said error detection information includes Error Correction Code (ECC).

15. The method of claim 11 wherein said first circuit is said CAM.

16. The method of claim 15 wherein said data stored in said first circuit represents compare value stored bits.

17. The method of claim 11 wherein said first circuit is said TCAM.

18. The method of claim 17 wherein said data stored in said first circuit represents mask value stored bits.

19. The method of claim 17 wherein said data stored in said first circuit represents compare value stored bits.

20. An arrangement for remedying data corruption in a first circuit, said first circuit representing one of a content addressable memory (CAM) and a ternary content addressable memory (TCAM), comprising:
a random access memory (RAM) circuit, said RAM circuit being external to said first circuit, said RAM circuit being configured for storing error detection information for data stored in said first circuit;
an error detection information generator coupled to said RAM circuit, said error detection information generator being configured to receive data destined to be stored in said first circuit and computing at least a portion of said error detection information from said data destined to be stored in said first circuit; and
a second circuit implementing a state machine for scrubbing said data stored in said first circuit, said scrubbing being configured to correct stored bit patterns that fail an error detection test using error detection information corresponding to said stored bit patterns, said stored bit patterns being read from said first circuit during scrubbing cycles of said first circuit.

21. The arrangement of claim 20 wherein said scrubbing includes sequentially reading and correcting subsets of said stored bit patterns in different idle cycles of said first circuit.

22. The arrangement of claim 20 wherein said scrubbing reads two consecutive stored bit patterns in idle cycles that are uninterrupted by one of a read, write, and compare activity with respect to data stored in said first circuit.

23. The arrangement of claim 20 wherein said scrubbing reads two consecutive stored bit patterns in idle cycles that are interrupted by one of a read, write, and compare activity with respect to data stored in said first circuit.

24. The arrangement of claim 20 wherein said error detection information represents parity information.

25. The arrangement of claim 20 wherein said error detection information includes Error Correction Code (FCC).

26. The arrangement of claim 20 wherein said first circuit is said CAM.

27. The arrangement of claim 26 wherein said data stored in said first circuit represents compare value stored bits.

28. The arrangement of claim 20 wherein said first circuit is said TCAM.

29. The arrangement of claim 28 wherein said data stored in said first circuit represents mask value stored bits.

30. The arrangement of claim 28 wherein said data stored in said first circuit represents compare value stored bits.

* * * * *

UNITED STATES PATENT AND TRADEMARK OFFICE
CERTIFICATE OF CORRECTION

PATENT NO. : 7,757,152 B2
APPLICATION NO. : 11/207357
DATED : July 13, 2010
INVENTOR(S) : John Wickeraad et al.

Page 1 of 1

It is certified that error appears in the above-identified patent and that said Letters Patent is hereby corrected as shown below:

In column 10, line 22, in Claim 25, delete "(FCC)." and insert -- (ECC). --, therefor.

Signed and Sealed this
Eighth Day of November, 2011

David J. Kappos
*Director of the United States Patent and Trademark Office*